United States Patent
Isokawa

(10) Patent No.: US 6,686,607 B2
(45) Date of Patent: Feb. 3, 2004

(54) STRUCTURE AND METHOD FOR MOUNTING A SEMICONDUCTOR ELEMENT

(75) Inventor: Shinji Isokawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/150,977

(22) Filed: May 21, 2002

(65) Prior Publication Data

US 2002/0175331 A1 Nov. 28, 2002

(30) Foreign Application Priority Data

May 22, 2001  (JP) ........................................ 2001-151836

(51) Int. Cl.$^7$ .................... H01L 27/15; H01L 31/12; H01L 33/00
(52) U.S. Cl. ............................ 257/79; 257/99; 257/431; 257/432; 257/777; 257/778; 257/782; 257/783
(58) Field of Search ..................... 257/79, 99, 431–432, 257/777–778, 782–783

(56) References Cited

U.S. PATENT DOCUMENTS

| | | | | |
|---|---|---|---|---|
| 3,981,073 A | * | 9/1976 | Dully | 438/500 |
| 3,982,260 A | * | 9/1976 | Wald | 257/450 |
| 5,045,409 A | * | 9/1991 | Eberspacher et al. | 428/620 |
| 5,384,267 A | * | 1/1995 | Hutchins et al. | 438/59 |
| 5,554,887 A | * | 9/1996 | Sawai et al. | 257/737 |
| 5,568,291 A | * | 10/1996 | Murata et al. | 349/110 |
| 5,641,996 A | * | 6/1997 | Omoya et al. | 257/787 |
| 5,818,072 A | * | 10/1998 | Schetzina | 257/78 |
| 6,093,964 A | * | 7/2000 | Saitoh | 257/738 |
| 6,334,567 B1 | * | 1/2002 | Xie et al. | 228/110.1 |

FOREIGN PATENT DOCUMENTS

JP       59124713 A   *  7/1984  .......... 257/E21.144

* cited by examiner

Primary Examiner—Amir Zarabian
Assistant Examiner—Ida M. Soward
(74) Attorney, Agent, or Firm—Morgan, Lewis & Bockius LLP

(57) ABSTRACT

A semiconductor element 4 is fixed with an indium film 3 that is formed on an electrode 2 by plating. This permits precise control of the amount of indium applied to the electrode and thus secure fixing of the semiconductor element 4 on the electrode 2. To minimize loss in the light emission efficiency of the semiconductor element 4 and variations of the hue of the light it emits, the indium film 3 has a thickness preferably in the range from 5 to 10 $\mu$m. Using a ZnSe-based light-emitting element as the semiconductor element 4 is more effective. To ensure secure and economical fixing of the semiconductor element 4 on the electrode 2 with the indium film 3, the indium film 3 formed on the electrode has an area preferably in the range from 1.1 to 1.5 times the area of the surface over which the semiconductor element 4 is fixed.

3 Claims, 3 Drawing Sheets

STRUCTURE AND METHOD FOR MOUNTING A SEMICONDUCTOR ELEMENT

BACKGROUND OF THE INVENTION

1. Field of the Invention

The present invention relates to a structure and a method for mounting a semiconductor element, and more particularly to a structure and a method for mounting a semiconductor element which use indium as conducting adhesive.

2. Description of the Prior Art

In a chip-type semiconductor device or the like which incorporates a semiconductor element, the fixing of the semiconductor element on an electrode formed on a chip substrate is achieved by applying indium, which acts as conducting adhesive, to the electrode, then placing the semiconductor element on top of it, and then heating the indium to melt it and then cooling it to solidify it. FIG. 3 shows a conventional mounting structure. First, by the use of a pin 7, molten indium 6 is applied to the surface of an electrode 2 formed on a chip substrate 1((*a*) in FIG. 3). The molten indium 6 applied to the electrode 2, under its surface tension, forms a drop, making a certain angle θ with the electrode 2((*b*) in FIG. 3). Next, a semiconductor element 4 is placed on the molten indium 6((*c*) in FIG. 3). Then, the molten indium 7 is cooled so as to be solidified. In this way, the semiconductor element 4 is mounted on the electrode 2((*d*) in FIG. 3).

However, in this conventional mounting structure, it is difficult to precisely control the amount of indium applied to the electrode, causing the indium to be applied to the electrode in an insufficient amount sometimes and in an excessive amount other times. In a case where the semiconductor element is a light-emitting element, an excessive amount of indium applied to the electrode causes the indium to attach not only to the bottom surface of the semiconductor element (light-emitting element) 4 but also to its side surfaces, shutting off part of the light emitted by the light-emitting element 4 and thus lowering light emission efficiency. With a light-emitting element such as a ZnSe-based light-emitting element which produces white light by emitting light in two colors, indium attached to its side surfaces, by shutting off part of the emitted light, upsets the balance of the two colors and causes variations in the resulting hue.

SUMMARY OF THE INVENTION

An object of the present invention is to realize secure mounting of a semiconductor element on an electrode through precise control of the amount of indium applied to the electrode.

Another object of the present invention is to realize, in a case where a light-emitting element is dealt with as a semiconductor element, fixing of the light-emitting element on an electrode without loss in light emission efficiency or variations in the hue of the emitted light.

To achieve the above objects, according to the present invention, in a structure for mounting a semiconductor element, the semiconductor element is fixed with an indium film that is formed on an electrode by plating. This structure permits precise control of the amount of indium applied to the electrode, and thus permits secure mounting of the semiconductor element on the electrode. By preparing beforehand a substrate having an indium film formed in a predetermined position on an electrode and then mounting a semiconductor element on that substrate, it is possible to eliminate the process of applying indium when a semiconductor element is mounted as required conventionally, and thereby increase working efficiency in the semiconductor element mounting process.

Here, to minimize loss in the light emission efficiency of the light-emitting element and variations in the hue of the light it emits, the indium film has a thickness preferably in the range from 5 to 10 $\mu$m.

To achieve the full effect of the mounting structure of the invention, the semiconductor element is preferably a ZnSe-based light-emitting element.

To ensure secure and economical fixing of the semiconductor element on the electrode with the indium film, the indium film formed on the electrode has an area preferably in the range from 1.1 to 1.5 times the area of the surface over which the semiconductor element is fixed.

To achieve the above objects, according to the present invention, a method for mounting a semiconductor element includes the steps of forming an indium film on an electrode by plating, placing a semiconductor element on the indium film, and melting and then solidifying the indium film so that the semiconductor element is fixed on the electrode. This method permits precise control of the amount of indium applied to the electrode, and thus permits secure mounting of the semiconductor element on the electrode.

Here, to obtain the desired thickness efficiently, the plating is achieved preferably by electroplating.

For quick and secure fixing of the semiconductor element with the indium film, the fixing is achieved by means of at least one of heat, supersonic vibration, and mechanical vibration.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

As a result of an intense study made in search of ways of precisely controlling the amount of indium applied to an electrode and securely mounting a semiconductor element on the electrode, the inventor of the present invention has found out that those ends are achieved by plating an electrode with indium, which acts as conducting adhesive, to form a thin film of indium on it and then fixing a semiconductor element on the thin film, which finding has led to the present invention.

Figure 1:
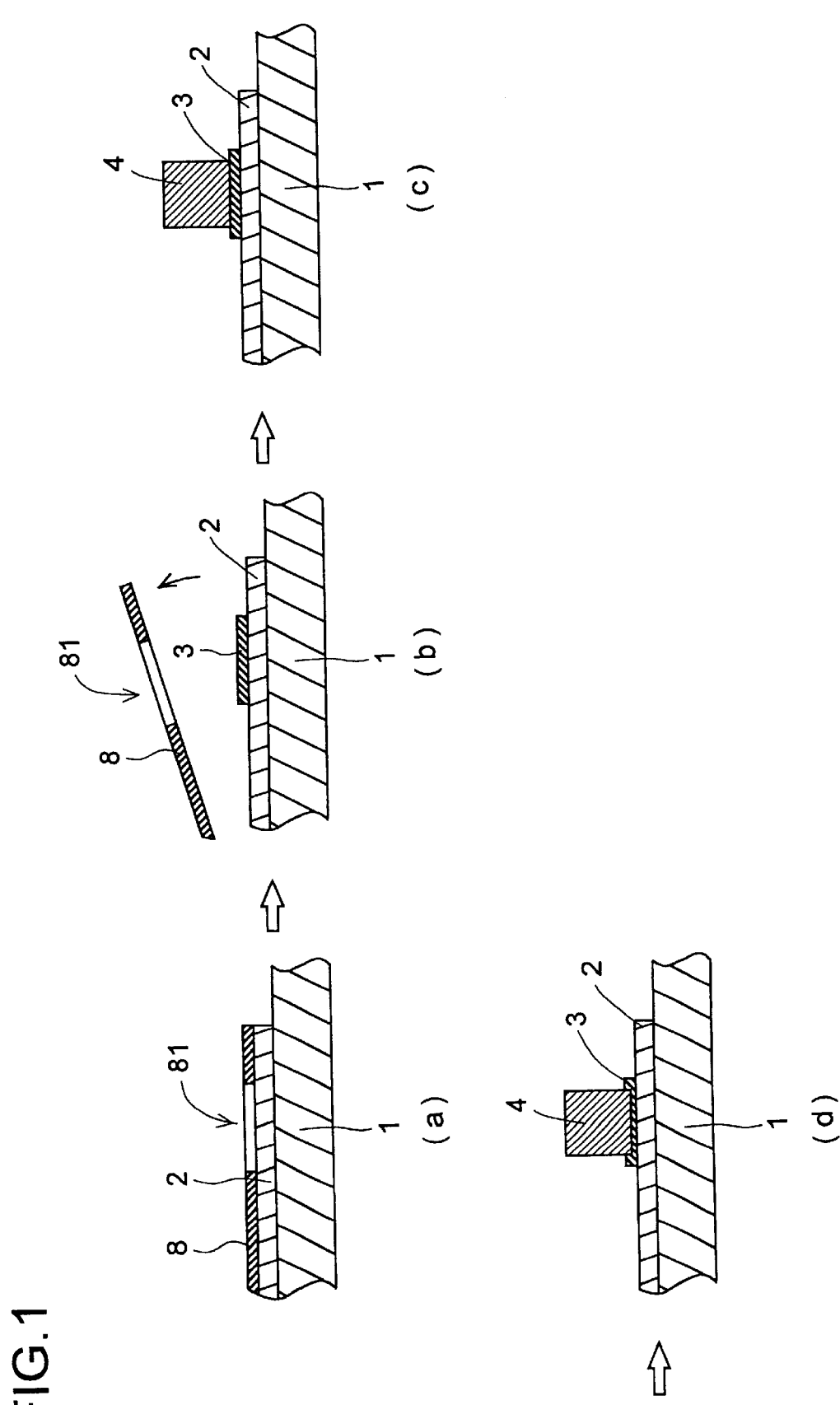
FIG. 1 is a process diagram showing an example of the mounting structure and mounting method according to the invention.

FIG. 1 is a process diagram showing an example of the mounting structure and mounting method according to the invention. First, as shown at (a) in FIG. 1, the surface of an electrode is covered with a masking member 8 having an opening 81 formed in the position where to form an indium film 3. Then, the indium film 3 is formed by plating ((b) in FIG. 1). The plating here may be achieved by any known plating method that can form the indium film 3, for example, electroplating, electroless plating, or hot dripping. Among these methods, electroplating is preferred because it efficiently offers the desired film thickness as will be described later.

Electroplating may be performed under any conditions appropriately determined according to the desired film thickness. For example, in a case where a liquid electrolyte containing indium methanesulfonate as its main ingredient is used, electroplating is performed at room temperature, at an electrolyte pH of 1.5 to 3.0, and at a cathode current density of 0.5 to 5 A/dm$^2$.

The thickness of the indium film 3 may be determined appropriately according to the type, size, and the like of the semiconductor element. To enhance productivity, and to minimize loss in the light emission efficiency of the light-emitting element and variations in the hue of the light it emits, the indium film 3 is given a thickness preferably in the range from 5 to 10 μm. A thickness smaller than 5 μm may result in insufficient bonding strength. On the other hand, a thickness greater than 10 μm may result in loss in the light emission efficiency of the light-emitting element and variations in the hue of the light it emits.

The shape of the indium film as viewed from above may be determined appropriately according to the shape of the surface of the semiconductor element over which it is fixed. The indium film is given an area preferably in the range from 1.1 to 1.5 times the area of the surface over which the semiconductor element is fixed. Giving the indium film an area smaller than 1.1 times the area of the surface over which the semiconductor element is fixed may result in insecure fixing of the semiconductor element. On the other hand, giving it an area greater than 1.5 times the area of the fixing surface may result in an unduly large portion of the indium film being wasted so as not to contribute to the fixing of the semiconductor element.

Next, as shown at (c) in FIG. 1, a semiconductor element 4 is mounted on the indium film 3 formed on the electrode 2. The semiconductor element 4 used here may be of any known type, for example, a light-emitting element, light-sensing element, or compound element. In particular, using a light-emitting element as the semiconductor element makes possible more effective use of the mounting structure of the invention, which prevents more indium than necessary from attaching to the side surfaces of the light-emitting element. Among various types of light-emitting element, a ZnSe-based light-emitting element makes possible particularly effective use of the mounting structure of the invention. Here, a ZnSe-based light-emitting element refers to a light-emitting element in which a ZnSe-based thin film is grown epitaxially on a ZnSe substrate doped at the center of self-excited light so that the thin film as an LED element emits blue light, then this blue light is passed through the substrate so that yellow or yellowish green light is emitted as a result of self-excitation, and then the light of those two colors is mixed to produce white light.

Next, the indium film 3 is melted and then solidified so that the semiconductor element is fixed on the electrode ((d) in FIG. 1). Here, the fixing with the indium film is achieved by means of heat, supersonic vibration, or mechanical vibration (so-called scrubbing) produced by a cam or the like.

In a case where the fixing is achieved by means of heat, the indium film 3 is first heated to about 200° C. so as to be melted and is then cooled so as to be solidified so that the semiconductor element 4 is fixed on the electrode 2. For example, the conventional fixing method in which a semiconductor element 4 is fixed by putting a chip-type semiconductor device in a reflow furnace can be used without any modification.

In a case where the fixing is achieved by means of supersonic vibration or by scrubbing, the conventional fixing conditions under which the second bonding of gold wires is performed can be adopted here. One or both of the semiconductor element 4 and the electrode 2 are vibrated in a horizontal or vertical direction.

Figure 2:
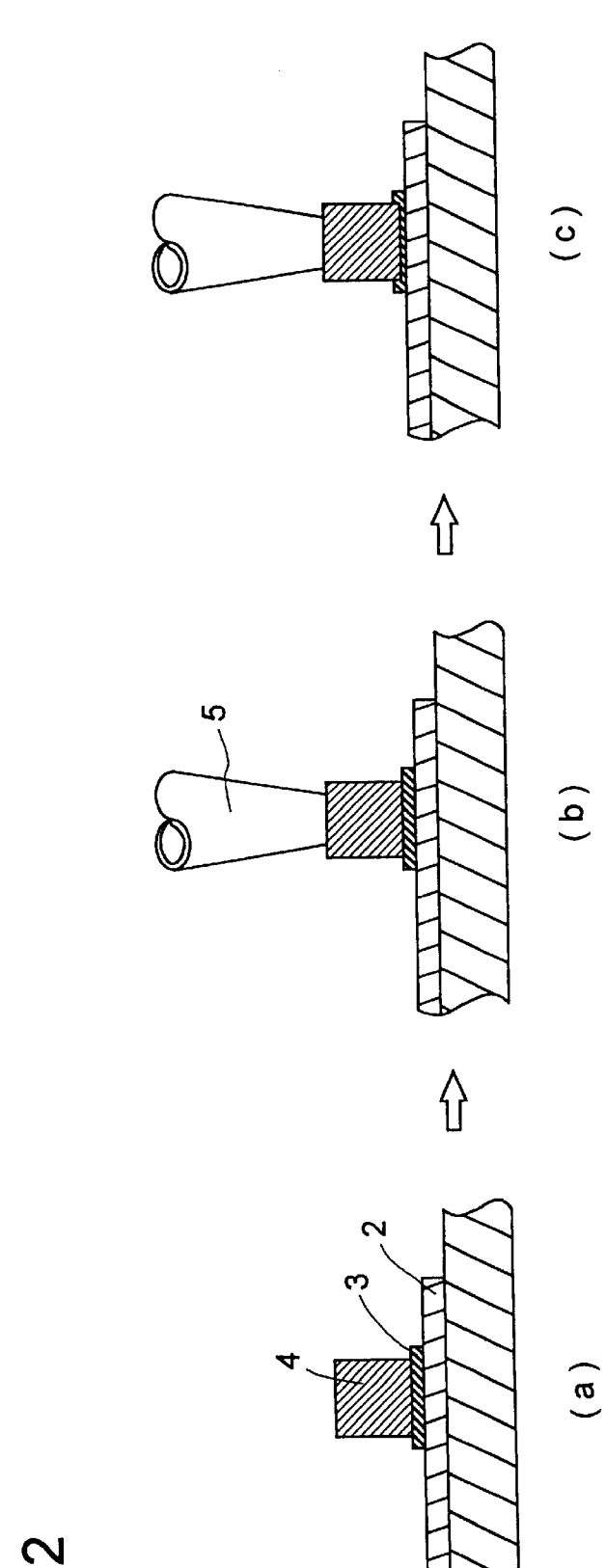
FIG. 2 is a diagram illustrating the melting of the indium film by means of supersonic vibration.
Figure 3:
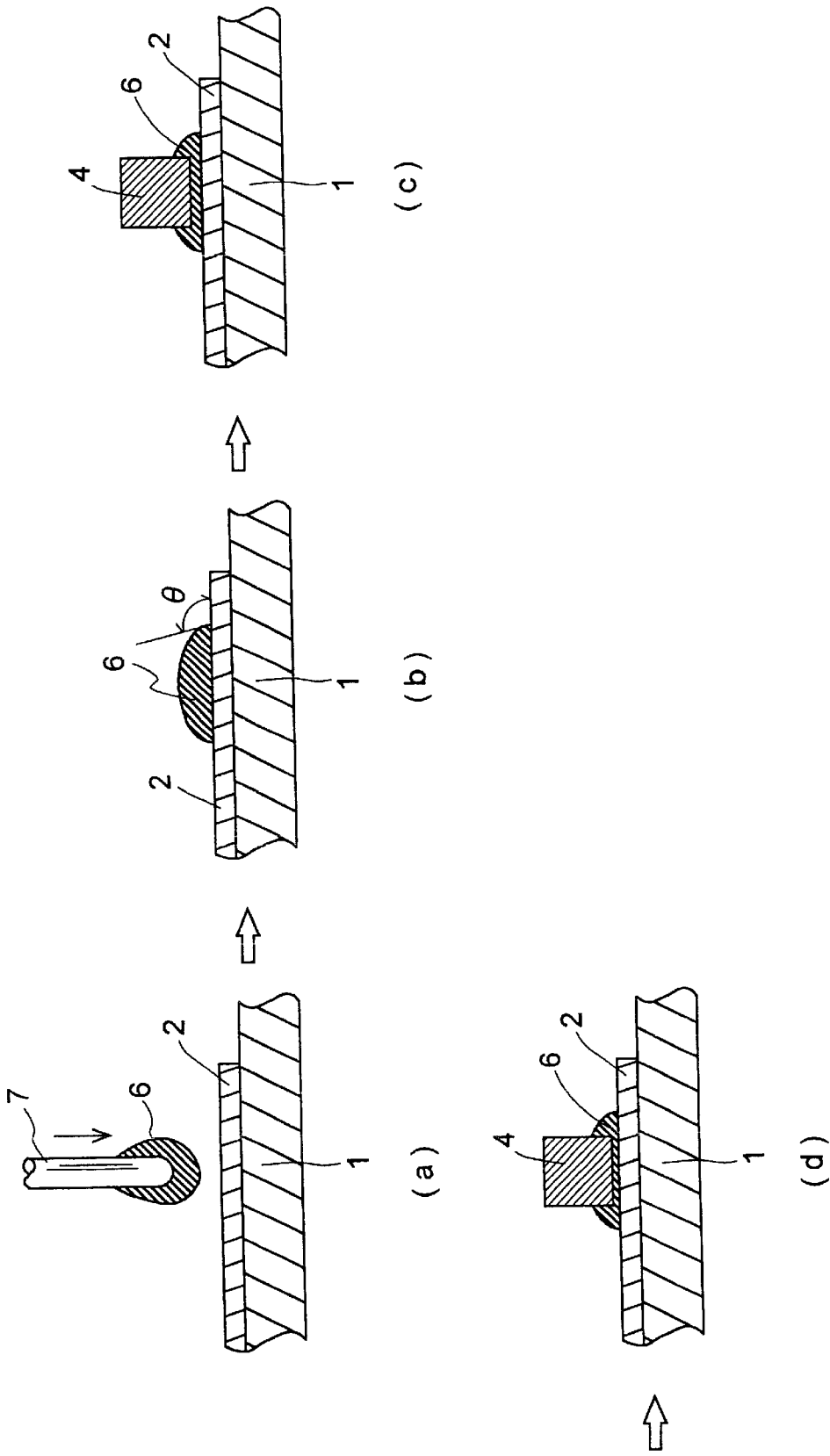
FIG. 3 is a process diagram showing the conventional mounting structure.

FIG. 2 shows an example of how the semiconductor element 4 is fixed on the electrode 2 by means of supersonic vibration. First, the semiconductor element 4 is placed on the indium film 3 formed on the surface of the electrode 2((a) in FIG. 2). Then, the top surface of the semiconductor element 4 is pressed with a supersonic horn 5, which is then made to vibrate at a supersonic frequency. The vibration from the vibration horn 5 conducts not only to the semiconductor element 4 but also through the semiconductor element 4 to the indium film 3 contiguous with the bottom surface and the lower portions of the side surfaces of the semiconductor element 4, making the semiconductor element 4, indium film 2, and electrode 2 vibrate violently at a supersonic frequency ((b) in FIG. 2). This supersonic vibration produces frictional heat, which melts the indium film 3 and thereby permits the semiconductor element 4 to be fixed on the electrode 2((c) in FIG. 2). In FIG. 2, the supersonic horn 5 makes contact with the top surface of the semiconductor element 4; however, it is also possible to bring the supersonic horn 5 into contact with a side surface of the semiconductor element 4 or with the bottom surface or a side surface of the substrate 1

The semiconductor element can be fixed on the electrode in a manner satisfactory in practical terms either by means of heat as described earlier or by means of supersonic vibration as described just above. For quicker and more secure fixing, however, it is recommended that the semiconductor element be first fixed on the electrode by means of supersonic vibration or by scrubbing and then heated to about 200 to 250° C. for aging.

What is claimed is:

1. A structure for mounting a semiconductor element by fixing the semiconductor element with an indium film formed on an electrode by plating, wherein the indium film formed on the electrode has an area in a range from 1.1 to 1.5 times an area of a surface over which the semiconductor element is fixed.

2. A structure for mounting a semiconductor element as claimed in claim 1, wherein the semiconductor element is a ZnSe-based light-emitting element.

3. A structure for mounting a semiconductor element as claimed in claim 1, wherein the indium film has a thickness in a range from 5 to 10 μm.

* * * * *